(12) United States Patent
Bender

(10) Patent No.: US 10,890,545 B2
(45) Date of Patent: Jan. 12, 2021

(54) APPARATUS FOR COMBINED STEM AND EDS TOMOGRAPHY

(71) Applicant: IMEC vzw, Leuven (BE)

(72) Inventor: Hugo Bender, Edegem (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/401,024

(22) Filed: May 1, 2019

(65) Prior Publication Data
US 2019/0323977 A1    Oct. 24, 2019

Related U.S. Application Data

(63) Continuation of application No. PCT/EP2017/077016, filed on Oct. 23, 2017.

(30) Foreign Application Priority Data

Nov. 9, 2016 (EP) .................................. 16197907

(51) Int. Cl.
*G01N 23/2251* (2018.01)
*H01J 37/147* (2006.01)
(Continued)

(52) U.S. Cl.
CPC ...... *G01N 23/2251* (2013.01); *H01J 37/1478* (2013.01); *H01J 37/20* (2013.01);
(Continued)

(58) Field of Classification Search
CPC ..... H01J 2237/24485; H01J 2237/2802; H01J 37/26; H01J 2237/057; H01J 2237/2442;
(Continued)

(56) References Cited

U.S. PATENT DOCUMENTS 4,288,692 A * 9/1981 Schamber ............ G01N 23/225
250/310
5,317,154 A    5/1994 Honda
(Continued)

OTHER PUBLICATIONS

Jarausch, et al.: "Four-dimensional STEM-EELS: Enabling nanoscale chemical tomography," Ultramicroscopy, Mar. 1, 2009, 109(4):326-337, DOI: 10.1016/J.ULTRAMIC.2008.12.012.
(Continued)

*Primary Examiner* — David A Vanore
(74) *Attorney, Agent, or Firm* — Knobbe Martens Olson & Bear, LLP

(57) ABSTRACT

The disclosed technology relates to an apparatus for tomographic analysis of a specimen based on STEM images of the specimen, as well as for tomographic analysis of the chemical composition of the specimen based on X-ray detection by EDS detectors. In one aspect, the apparatus comprises an elongated specimen holder that is rotatable about a longitudinal axis and is configured to hold a pillar-shaped specimen at the end of the holder. The longitudinal axis is positioned in a sample plane which is perpendicular to the beam direction of an electron beam produced by an electron gun. The apparatus also comprises at least two EDS detectors, each EDS detector having a detecting surface oriented perpendicularly to the sample plane and intersecting with the sample plane, wherein the two EDS detectors are positioned on opposite lateral sides of the specimen.

20 Claims, 2 Drawing Sheets

(51) Int. Cl.
   *H01J 37/20* (2006.01)
   *H01J 37/28* (2006.01)
   *H01J 37/244* (2006.01)
(52) U.S. Cl.
   CPC .............. *H01J 37/28* (2013.01); *H01J 37/244* (2013.01); *H01J 2237/20214* (2013.01); *H01J 2237/2442* (2013.01); *H01J 2237/24495* (2013.01); *H01J 2237/2802* (2013.01)
(58) Field of Classification Search
   CPC ..... H01J 2237/2446; H01J 2237/24475; H01J 2237/2448; H01J 2237/28; H01J 37/261; H01J 49/0004; H01J 49/0027; H01J 49/025; H01J 49/44; G01N 23/2252; G01N 2223/418; G01N 23/046; G01N 23/2251
   USPC ......... 250/310, 307, 306, 305, 311, 396 ML, 250/397, 399
   See application file for complete search history.

(56) References Cited

U.S. PATENT DOCUMENTS

| | | | | |
|---|---|---|---|---|
| 7,294,834 | B2* | 11/2007 | Khursheed | G01N 23/225 250/307 |
| 8,314,386 | B2* | 11/2012 | Zaluzec | H01J 37/244 250/306 |
| 8,748,816 | B2* | 6/2014 | Kooijman | G01N 23/203 250/310 |
| 10,132,761 | B2* | 11/2018 | Aoyama | G01N 23/2252 |
| 10,224,174 | B1* | 3/2019 | Freitag | H01J 37/147 |
| 10,607,901 | B2* | 3/2020 | Hiblot | G01L 1/2293 |
| 2011/0291008 | A1 | 12/2011 | Luo et al. | |
| 2012/0326032 | A1 | 12/2012 | Benner et al. | |
| 2013/0240730 | A1 | 9/2013 | Hasuda | |
| 2015/0168320 | A1 | 6/2015 | Falke et al. | |
| 2016/0020062 | A1* | 1/2016 | Parker | H01J 37/26 250/307 |
| 2016/0276130 | A1* | 9/2016 | Mele | H04N 5/32 |
| 2019/0311880 | A1* | 10/2019 | Tiemeijer | H01J 37/243 |
| 2019/0323977 | A1* | 10/2019 | Bender | H01J 37/20 |
| 2019/0341243 | A1* | 11/2019 | Freitag | H01J 49/44 |

OTHER PUBLICATIONS

Schlossmacher, et al.: "Enhanced detection sensitivity with a new windowless XEDS system for AEM based on silicon drift detector technology," Microscopy Today, Jul. 1, 2010, 18(4):14-20, DOI: 10.1017/S1551929510000404.

International Search Report and Written Opinion issued in International Application No. PCT/EP2017/077016 dated Dec. 12, 2017.

* cited by examiner

APPARATUS FOR COMBINED STEM AND EDS TOMOGRAPHY

CROSS-REFERENCE TO RELATED APPLICATIONS

This application is a continuation of International Patent Application PCT/EP17/077016, filed on Oct. 23, 2017, which is incorporated herein by reference in its entirety. This application also claims foreign priority to European Application EP 16197907.5, filed on Nov. 9, 2016, which is incorporated herein by reference in its entirety.

BACKGROUND

Technological Field

The disclosed technology relates to the tomographic analysis of specimens by scanning transmission electron microscopy, as well as to composition-based tomography of the specimen by energy dispersion X-ray spectroscopy.

Description of the Related Technology

Tools for transmission electron microscopy (TEM) and scanning transmission electron microscopy (STEM) are being actively researched. Most of these tools allow a tomographic analysis of a specimen by exposing the specimen to an electron beam, wherein the specimen is tilted about an axis perpendicular to the beam direction, through a range of tilt angles, allowing to obtain a sequence of 2D-images of the specimen. Images are obtained on the basis of transmitted electrons. In TEM, a large diameter electron spot is used on the specimen and images are projected through an electro-magnetic lens system and captured on a fluorescent screen combined with a CCD camera. In STEM, the specimen is scanned by a fine focused beam and the image is built-up synchronously on the basis of transmitted electrons scattered over a range of angles and captured in different angular ranges by dedicated detectors. The set of 2D-images acquired in the tilt series is then processed by back-projection algorithms which take into account the respective tilting angles and reconstruct the 3D volume of the specimen. 2D slices can be extracted through that volume in any direction, or 3D-contours of different features in the sample can be obtained.

TEM-based Tomography has found particular interest in the study of materials and micro-electronic structures produced in the semiconductor industry. A number of different types of STEM detectors being developed can collect electrons scattered at different angular ranges, such as detectors for High Angle Annular Dark Field STEM (HAADF-STEM), Dark Field STEM (DF-STEM), Annular Bright Field STEM (ABF-STEM) or Bright Field STEM (BF-STEM). In state-of-the-art STEM tools, a combination of various detectors is available, which allow to obtain different and complementary images of the same specimen in a correlated way.

Energy dispersion X-ray spectroscopy (abbreviated as EDS or EDX) is a chemical composition analysis technique based on the detection of X-rays emitted by a specimen bombarded by an electron beam. By analysis of the emitted X-ray spectrum, the chemical composition of the specimen can be detected and quantified. Dedicated EDS detectors are positioned around the specimen for capturing the emitted X-rays. An example of an EDS detector is the silicon drift detector (SDD), which comprises a series of ring-shaped electrodes distributed over a detecting surface area. The electrodes generate a transversal field that causes charge carriers generated by incident X-rays to drift towards a collection electrode. The detecting surfaces of SDD detectors are mostly circular shaped but more elongated shapes have also been produced. A characterising feature of any EDS detector is the surface area of its detecting surface. Present-day SDDs have detection surface areas ranging from 30 $mm^2$ to 100 $mm^2$.

Given the fact that STEM and EDS are based on the detection of events generated by the bombardment of a specimen by a focused electron beam, the two techniques may be combined in the same tool. These tools comprise one or multiple types of STEM detectors placed underneath the specimen, and a plurality of EDS detectors at positions around the specimen. The tomographic analysis may then be based both on images of the specimen, and on spectroscopic maps corresponding to the images. TEM-based Tomography is more useful for biological and organic materials. Owing to the large electron beam spot used in TEM, it is not suitable for combination with EDS tomography.

One exemplary configuration for STEM and EDS comprises four SDDs placed above the specimen, at regular intervals around a vertical axis oriented along the e-beam direction. This configuration is illustrated in FIG. 1. An electron gun (not shown) produces a focused beam directed at a specimen 11 held by a specimen holder 12. The beam propagates in the beam direction 100 and is focused by a magnetic lens arrangement 10. The drawing is merely a schematic representation of what may in reality be a more complex lens system, including lenses extending above and below the specimen. The apparatus further comprises scan coils or equivalent deflection means (not shown) in the lens system above the specimen 11 for scanning the beam over an area of the specimen. Underneath the specimen, a number of STEM detectors are mounted: a BF-detector 13, a DF detector 14 and a HAADF-detector 15. Different configurations of the STEM detectors are possible with the detectors at different heights (as shown in the drawing) or with detectors arranged in single plane.

The SDDs 1 are shown schematically as having a housing 2 with the detector 3 mounted in the housing. The front surface 3' of the detector is referred to in the present context as the SDD's 'detecting surface'. The SDDs are tilted over an angle α with respect to the plane 4 in which the specimen 11 is held. This tilted position is related to the type of sample holders that is typically used in TEM/STEM tools. The holder 12 is configured to contain a thin slice 11 of material so as to allow optimum transmission of the e-beam through the specimen. X-rays are emitted in all directions but are only collected in the solid angle of the cones from the emission point in the sample towards the detecting surfaces of the SDD's. The construction of the holder 12 can create a shadow effect for the X-ray emission in the direction towards the detectors, hence the required tilted position of the SDDs. Improved shape holder designs have mitigated this restriction, with the optimum case being the holder designed to grasp a nanometer-scaled pillar-shaped specimen.

Despite these improvements, the integration of STEM and EDS in a single tool remains open to further progress. The main problem involves the relatively low yield of X-rays and the limited solid angle of detection. Therefore the acquisition times required for EDS maps with sufficient signal to noise ratio, are currently much higher than for STEM image acquisition, so that a fast tomographic analysis of both the morphology and the chemical composition of a specimen is not possible. Usually STEM images are taken during one scanning operation, and EDS data are acquired and accumulated during a series of additional scans wherein the beam is scanned faster over the specimen, because otherwise the beam would damage the specimen due to the long time it would have to remain focused on each point in order to acquire sufficient X-rays. This results in long experiments, with STEM and EDS data taken at different moments, so that the acquisitions are not fully correlated.

Whereas the X-ray yield is a physical limitation, the solid angle of detection is related to the design of the STEM/EDS apparatus. The value of the solid angle depends on the distance between the detector and the specimen as well as on the surface area of the SDD's detecting surface. Even though larger-area detectors are being developed, it is not always possible to place these larger detectors closer to a sample in the configurations which are known today, due to constructional constraints, such as the lens systems 10 and the shadow effect described above.

SUMMARY OF CERTAIN INVENTIVE ASPECTS

The disclosed technology relates to an apparatus and method for combined and correlated STEM and EDS tomography analysis wherein the above-named disadvantages are overcome.

In one aspect, the disclosed technology relates to an apparatus for tomographic analysis of a specimen based on STEM images of the specimen, as well as for tomographic analysis of the chemical composition of the specimen based on X-ray detection by EDS detectors, the apparatus comprising:
an electron gun for producing an electron beam that propagates in a beam direction,
a lens arrangement for focusing the beam on the specimen,
a specimen holder for positioning the specimen, the holder being rotatable about an axis perpendicular to the beam direction,
one or more detectors for capturing STEM images,
a set of EDS detectors, characterized in that:
the specimen holder is an elongated holder that is rotatable about a longitudinal axis and that is configured to hold a pillar-shaped specimen having a proximal end and a distal end, the proximal end being attached to the end of the holder and the distal end extending outward from the holder in the direction of the longitudinal axis, with the longitudinal axis being positioned in a sample plane, the sample plane being essentially perpendicular to the beam direction,
the apparatus comprises at least two EDS detectors, each EDS detector having a detecting surface oriented essentially perpendicularly to the sample plane and intersecting with the sample plane, and wherein the two EDS detectors are positioned on opposite sides of the longitudinal axis of the specimen holder so that the detecting surfaces are configured to face opposite sides of the specimen.

According to an embodiment, the apparatus further comprises a third EDS detector having a detecting surface that is:
essentially perpendicular to the sample plane and intersecting with the sample plane,
essentially perpendicular to the detector's longitudinal axis, so that the detecting surface of the third EDS detector is configured to face the distal end of the specimen.

According to an embodiment, the detecting surface of the EDS detectors is symmetrical with respect to the center of the detecting surface or with respect to a central line of the detecting surface, and wherein the EDS detectors are arranged so that the detecting surfaces are symmetrical with respect to the sample plane.

The distance between the detecting surfaces of the laterally placed EDS detectors and the longitudinal axis of the specimen holder may be between 2 mm and 5 mm.

According to an embodiment, the apparatus comprises one or more STEM detectors, wherein the apparatus is configured so that:
a STEM acquisition and an EDS acquisition take place during the same electron bombardment,
no STEM and EDS acquisitions are required which are taking place during different electron bombardments. The STEM acquisition and the EDS acquisition may take place simultaneously. The EDS detectors may be silicon drift detectors. According to an embodiment, the shape of the detecting surface of the EDS detectors is adapted to the configuration of the apparatus so as to be able to place the EDS detectors closer to the specimen compared to the case where the detecting surface is circular.

According to an embodiment, at least the laterally positioned EDS detectors are movable so that the EDS detectors can be placed closer to or farther away from the holder's longitudinal axis.

In another aspect, the disclosed technology relates to a method of performing a tomographic analysis of a pillar-shaped specimen with an apparatus according to the disclosed technology, the method comprising:
positioning a specimen at a series of angular positions about the longitudinal axis of the specimen holder,
at each angular position, directing an electron beam at subsequent raster points on the specimen,
for each raster point, acquiring signals from the one or more STEM detectors and signals from the EDS detectors, for obtaining 2-dimensional images and compositional maps of the specimen at the various angular positions,
applying a back-projection algorithm to reconstruct a 3-dimensional volume of the specimen in terms of the morphology and the chemical composition of the specimen,
wherein for each raster point, the STEM signals and the EDS signals are acquired during the same electron bombardment.

In the method of the disclosed technology, the STEM signals and the EDS signals may be acquired simultaneously.

BRIEF DESCRIPTION OF THE DRAWINGS

The figures are schematic illustrations of the principle characteristics of the invention. They are not drawn to scale of an actual apparatus.

DETAILED DESCRIPTION OF CERTAIN ILLUSTRATIVE EMBODIMENTS

The disclosed technology relates to an apparatus for STEM tomography analysis combined with EDS-based tomography analysis, with the following characteristics:

the specimen is pillar-shaped and held at the end of an elongated specimen holder, which allows rotation of the specimen about the holder's longitudinal axis over a range of at least 180°, or up to 360°;

at least two EDS detectors are provided, on opposite lateral sides of the specimen and with their detecting surfaces perpendicular to and intersecting with the sample plane, defined as the plane through the longitudinal axis of the specimen holder and perpendicular to the e-beam direction; and a STEM detecting configuration is provided.

Figure 1:
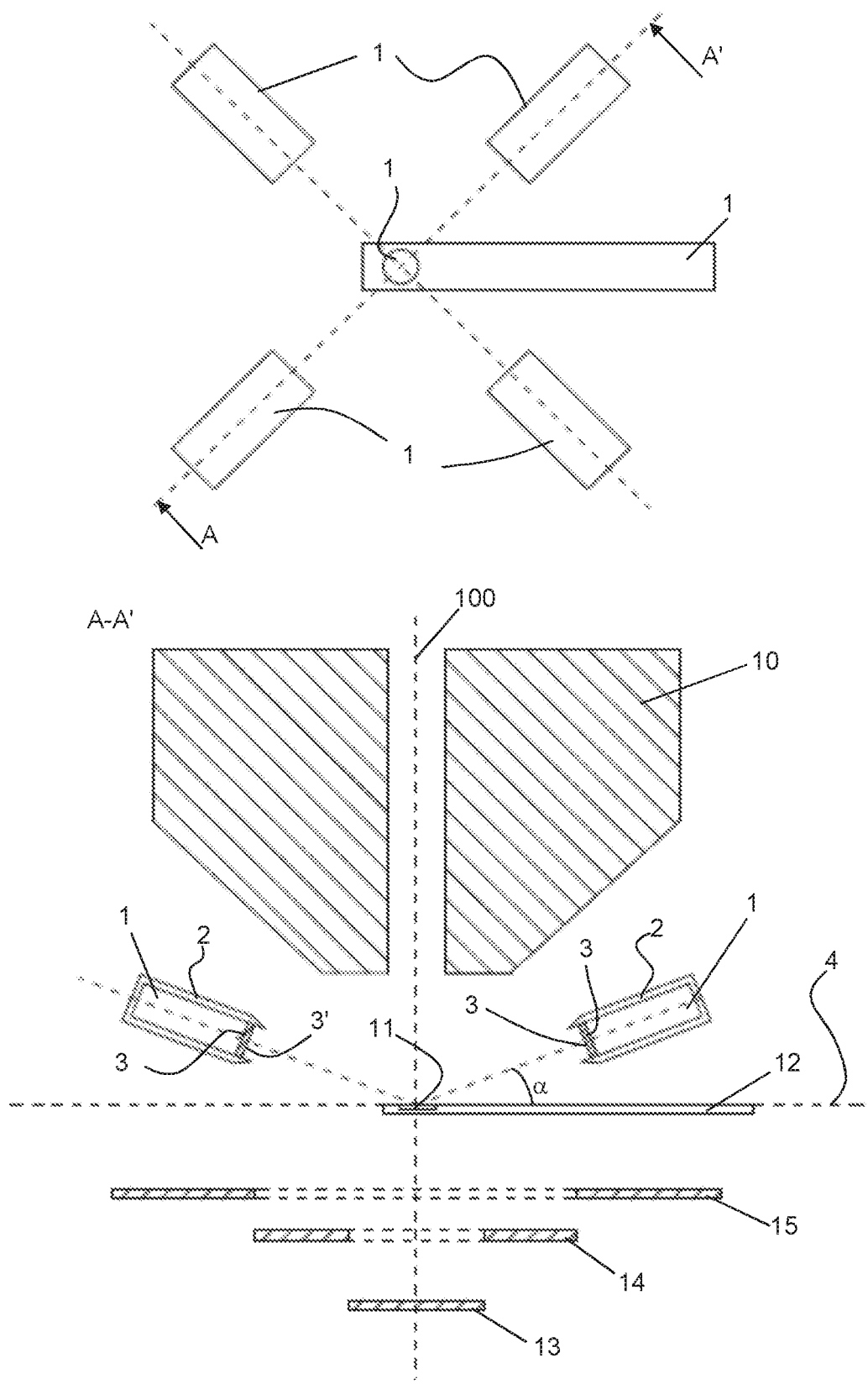
FIG. 1 describes a combined STEM/EDS configuration known in the prior art.
Figure 2:
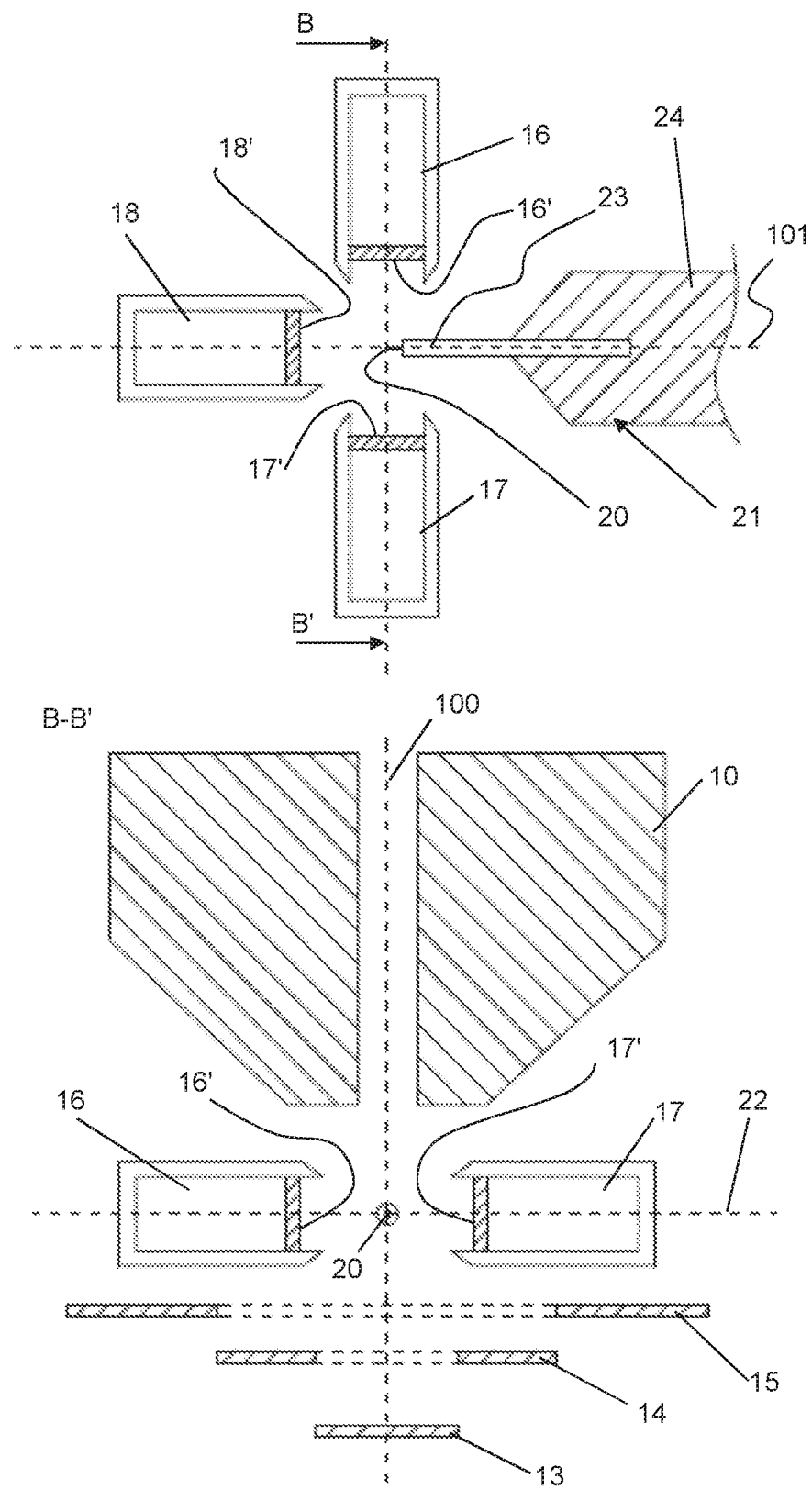
FIG. 2 describes a combined STEM/EDS configuration according to an exemplary embodiment of the disclosed technology.

FIG. 2 illustrates an apparatus according to an exemplary embodiment of the disclosed technology. An electron gun (not shown) produces an electron beam that is propagated along a beam direction 100, and focused through a magnetic lens arrangement 10. STEM detectors 13/14/15 are equally present and may be configured as in the system shown in FIG. 1. The EDS arrangement is different however. Three EDS detectors, for example SDDs 16/17/18, are mounted in close proximity to a pillar-shaped specimen 20, maintained by a specimen holder 21. The dimensions of the specimen 20 are in the order of nanometres in the direction transversal to the holder's longitudinal axis 101 which is also the rotation axis about which the holder 21 is rotatable, in a range of 360°. The sample plane 22 is equally indicated in the drawing. The sample plane is the plane through the holder's rotation axis 101 and perpendicular to the beam direction 100. Scan coils or equivalent deflection means (not shown) are in the lens system above the specimen 20, for deflecting the beam towards raster points of a raster overlying a scan area of the specimen. The beam direction 100 is defined as the direction of the beam before it is deflected by the deflection means. The specimen 20 is shaped as a pillar having a central longitudinal axis, a proximal end and a distal end, the proximal end being attached at the outer end of the holder 21, the distal end extending outward from the holder in the direction of the holder's longitudinal and rotation axis 101. The holder's rotation axis 101 may coincide as closely as possible with the central longitudinal axis of the specimen itself.

The specimen 20 may be produced from a solid material with nanometer-scale 3D non-uniformities, for example, a portion of an integrated circuit comprising nanometer-scale features. The specimen can be formed, e.g. by ion milling, into a conical or rectangular pillar shape containing a small number of 3D features in the vicinity of the tip of the specimen. Techniques to produce such a specimen can be performed by a person skilled in the art, and therefore are not described here in detail. The specimen 20 is maintained at the outer end of a wire-shaped support 23 that is itself held by a cylinder-shaped holder body 24, for example. The combination of the wire-shaped support 23 and the holder body 24 defines the specimen holder 21 applicable in an apparatus of the disclosed technology. This type of specimen holder can position pillar-shaped and nano-sized specimens.

The SDDs 16 and 17 are placed on opposite lateral sides of the specimen, with their detecting surfaces 16'/17' perpendicular to the sample plane 22 and facing (i.e. being turned towards) opposite sides of the specimen 20. These detecting surfaces may be circular in this embodiment and positioned symmetrically with respect to the sample plane 22, i.e. the sample plane divides the detecting surface in two symmetrical halves. The disclosed technology is, however, not limited to symmetrically shaped detectors. A more general requirement is that the sample plane 22 intersects with the detector surfaces 16'/17'.

In other words, the SDDs 16/17 are not located above the sample plane 22. The distance between the specimen holder's longitudinal axis 101 and the SDD's detecting surfaces 16'/17' may be the same for the two laterally placed SDDs 16/17. In the embodiment shown, a third SDD 18 is arranged perpendicularly to the other two (i.e. perpendicular to the axis 101), and facing the distal end of the pillar-shaped specimen 20. The third SDD 18 has its detecting surface 18' perpendicularly and, optionally, symmetrically arranged with respect to the sample plane 22, like the first two SDDs 16/17. This third SDD 18 is however optional. The apparatus of the disclosed technology is characterized by the presence of at least the laterally placed EDS detectors 16/17.

The lateral position of the SDDs 16/17 combined with the use of a pillar-shaped specimen 20 represents an important improvement over the prior art, as it allows to position the SDDs much closer to the specimen, leading to an important increase of the solid angle for each SDD. For example, the SDDs used in the prior art configuration of FIG. 1 are placed at a distance of 10-12 mm from the specimen. In the configuration of FIG. 2, the same SDD could be placed as close as 3 mm from the specimen, which represents a more than 10-fold increase of the solid angle. An exemplary range for the distance between the laterally placed detectors 16/17 and the rotation axis 101 is 2 to 5 mm. According to an embodiment, the EDS detectors (i.e. the lateral detectors 16/17 and/or the third detector 18) are movable. In this case the detectors can be displaced closer to or farther away from the sample so that the above-named distance may be adjusted. When only two SDDs 16/17 are used, the distance of each SDD to the specimen can be even smaller than when three SDDs 16/17/18 are used. The higher solid angle obtained because of the closer proximity of the EDS detectors to the sample allows to increase the count rate by the same factor as the solid angle increase. The higher count rate obtainable in an apparatus of the disclosed technology brings the EDS acquisition time within the range of acquisition times required for STEM images and hence allows fully correlated STEM and EDS analyses.

Following from the latter improvement, an exemplary embodiment of the disclosed technology is an apparatus as described above, configured for combined STEM and EDS tomographic analysis, wherein the STEM and EDS acquisitions are obtained simultaneously for one electron bombardment, so that the STEM and EDS images are fully correlated. One bombardment is defined within the present context as the exposure of one spot of the specimen to the focused e-beam at a constant power of the beam. In a STEM-analysis, the focused e-beam is scanned over a raster of these spots to thereby obtain an image of the complete specimen, i.e. a series of bombardments are done on various points of the specimen.

In the exemplary embodiment of the apparatus of the disclosed technology and in the method according to the disclosed technology, STEM and EDS acquisitions are obtained during the same electron bombardment, on each raster point. A 'STEM acquisition' is defined as a valid acquisition of the signals from all the STEM detectors in the apparatus (13/14/15 in the embodiment of FIG. 2), during an electron bombardment on a raster point. Likewise, an 'EDS acquisition' is defined as a valid acquisition of the signals from all the EDS detectors (16/17/18 in the embodiment of FIG. 2), during an electron bombardment on a raster point. An acquisition is 'valid' if it answers to a number of criteria in terms of signal-to-noise ratio and other characteristics, so that it can be used, either alone or as an accumulation of valid acquisitions, for producing an image (for STEM signals) or a composition map (for EDS signals). So in an apparatus of the disclosed technology and according to the method of the disclosed technology, every STEM acquisition is correlated to an EDS acquisition. No STEM and EDS acquisitions which take place during different electron bombardments (i.e. non-correlated acquisitions) are required to obtain 2D images of the morphology and the composition.

The exact time of one valid acquisition depends not only on the detectors but also on the hardware and software of the apparatus. Regardless of this, the acquisition time for obtaining sufficient X-ray signals with good signal to noise ratio with the EDS detectors in an apparatus of the disclosed technology is much shorter than in presently existing apparatuses, which is why the simultaneous acquisition of STEM and EDS signals, during an electron bombardment on a raster point, is possible within a single timespan that may be of the order of the acquisition time for the STEM detectors. The STEM and EDS acquisitions obtained during the single timespan may start and end simultaneously. Possibly a difference, e.g. a limited difference, may exist between the respective start and end times of the STEM and EDS acquisitions obtained during a given electron bombardment on a raster point. In all these cases, each STEM acquisition is correlated to an EDS acquisition. The total acquisition can be obtained by a single raster scan of the electron beam over the selected area or by several scans where the signals in each raster point are accumulated.

By performing STEM and EDS within the same time interval for each point of the raster, a dramatic reduction can be achieved of the time required to obtain a set of data for combined STEM and EDS based tomography. This makes it possible to perform combined and one-to-one correlated STEM and EDS tomography data acquisition with optimal sensitivity in reasonable times.

A number of variations of the above-described embodiments are within the scope of the invention. Any type of EDS detector can be used in the apparatus of the disclosed technology, instead of SDDs Like SDDs, alternative detector types have a detecting surface of a given size and shape. This detecting surface need not be circular. Other symmetrical shapes are possible, such as ellipse-shaped surfaces. The detecting surface may also be non-symmetrically shaped. The shape of the detecting surface may be optimized specifically in accordance with other components of the apparatus, for example, in accordance with the shape of the lens arrangement, to allow a further decrease (compared to the case of circular detecting surfaces) of the distance between the EDS detectors and the specimen. In addition to a rotation about its longitudinal axis 101, the sample holder 21 may perform a tilting motion about an axis that is also lying in the sample plane 22 and that is perpendicular to this longitudinal axis. This tilting motion may be of interest to align specimens exactly along crystal zone axes.

The specimen holder 21 may be movable as a whole in three orthogonal directions, in order to position the specimen. The range of movements in these three directions can be more limited compared to existing apparatuses because only the thin pillar-shaped specimen 20 and its wire shaped support 23 need to fit in the area between the SDD's 16/17 whereas the holder body 24 is outside that area.

The term 'pillar-shaped' for describing the specimen 20 includes all elongated specimens extending along a longitudinal axis, e.g. a symmetry axis for the pillar. The pillar may have a rectangular cross-section or it may be conically shaped, for example.

As stated, TEM-based Tomography is not suitable for combination with EDS tomography. The apparatus of the disclosed technology may, however, be configured to acquire TEM as well as STEM images. The acquisition of TEM images is then however not combined with EDS acquisition.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. An apparatus for tomographic analysis of a specimen based on scanning transmission electron microscopy (STEM) images of the specimen, as well as for tomographic analysis of the chemical composition of the specimen based on X-ray detection by energy dispersion X-ray spectroscopy (EDS) detectors, the apparatus comprising:
    an electron gun for producing an electron beam that propagates in a beam direction;
    a lens arrangement for focusing the beam on the specimen;
    a specimen holder for positioning the specimen, the holder being rotatable about an axis perpendicular to the beam direction;
    one or more detectors for capturing STEM images; and
    a set of EDS detectors,
    wherein the specimen holder is an elongated holder that is rotatable about a longitudinal axis and is configured to hold a pillar-shaped specimen having a proximal end and a distal end, the proximal end being attached to an end of the holder and the distal end extending outward from the holder in the direction of the longitudinal axis, the longitudinal axis being positioned in a sample plane, the sample plane being essentially perpendicular to the beam direction,
    wherein the apparatus comprises at least two EDS detectors, each EDS detector having a detecting surface oriented essentially perpendicularly to the sample plane and intersecting with the sample plane, and
    wherein the two EDS detectors are positioned on opposite sides of the longitudinal axis of the specimen holder such that the detecting surfaces are configured to face opposite sides of the specimen.

2. The apparatus according to claim 1, further comprising a third EDS detector having a detecting surface that is:
    essentially perpendicular to the sample plane and intersecting with the sample plane, and
    essentially perpendicular to the detector's longitudinal axis, such that the detecting surface of the third EDS detector is configured to face the distal end of the specimen.

3. The apparatus according to claim 2, wherein the detecting surface of the EDS detectors is symmetrical with respect to the center of the detecting surface or with respect to a central line of the detecting surface, and wherein the EDS detectors are arranged such that the detecting surfaces are symmetrical with respect to the sample plane.

4. The apparatus according to claim 2, wherein the distance between the detecting surfaces of the laterally placed EDS detectors and the longitudinal axis of the specimen holder is between 2 mm and 5 mm.

5. The apparatus according to claim 2, wherein the apparatus comprises one or more STEM detectors, and wherein the apparatus is configured such that:
   a STEM acquisition and an EDS acquisition take place during the same electron bombardment, and
   no STEM and EDS acquisitions are required which are taking place during different electron bombardments.

6. The apparatus according to claim 2, wherein the EDS detectors are silicon drift detectors.

7. The apparatus according to claim 2, wherein the shape of the detecting surface of the EDS detectors is adapted to the configuration of the apparatus so as to be able to place the EDS detectors closer to the specimen compared to an apparatus wherein the detecting surface is circular.

8. The apparatus according to claim 2, wherein at least the laterally positioned EDS detectors are movable, such that the EDS detectors can be placed closer to or farther away from the holder's longitudinal axis.

9. A method of performing a tomographic analysis of a pillar-shaped specimen with an apparatus according to claim 2, the method comprising:
   positioning the specimen at a series of angular positions about the longitudinal axis of the specimen holder;
   at each angular position, directing an electron beam at subsequent raster points on the specimen;
   for each raster point, acquiring signals from the one or more STEM detectors and signals from the EDS detectors, to obtain 2-dimensional images and compositional maps of the specimen at the various angular positions; and
   applying a back-projection algorithm to reconstruct a 3-dimensional volume of the specimen in terms of the morphology and the chemical composition of the specimen,
   wherein for each raster point, the STEM signals and the EDS signals are acquired during the same electron bombardment.

10. The apparatus according to claim 1, wherein the detecting surface of the EDS detectors is symmetrical with respect to the center of the detecting surface or with respect to a central line of the detecting surface, and wherein the EDS detectors are arranged such that the detecting surfaces are symmetrical with respect to the sample plane.

11. A method of performing a tomographic analysis of a pillar-shaped specimen with an apparatus according to claim 10, the method comprising:
   positioning the specimen at a series of angular positions about the longitudinal axis of the specimen holder;
   at each angular position, directing an electron beam at subsequent raster points on the specimen;
   for each raster point, acquiring signals from the one or more STEM detectors and signals from the EDS detectors, to obtain 2-dimensional images and compositional maps of the specimen at the various angular positions; and
   applying a back-projection algorithm to reconstruct a 3-dimensional volume of the specimen in terms of the morphology and the chemical composition of the specimen,
   wherein for each raster point, the STEM signals and the EDS signals are acquired during the same electron bombardment.

12. The apparatus according to claim 1, wherein a distance between the detecting surfaces of the laterally placed EDS detectors and the longitudinal axis of the specimen holder is between 2 mm and 5 mm.

13. A method of performing a tomographic analysis of a pillar-shaped specimen with an apparatus according to claim 12, the method comprising:
   positioning the specimen at a series of angular positions about the longitudinal axis of the specimen holder;
   at each angular position, directing an electron beam at subsequent raster points on the specimen;
   for each raster point, acquiring signals from the one or more STEM detectors and signals from the EDS detectors, to obtain 2-dimensional images and compositional maps of the specimen at the various angular positions; and
   applying a back-projection algorithm to reconstruct a 3-dimensional volume of the specimen in terms of the morphology and the chemical composition of the specimen,
   wherein for each raster point, the STEM signals and the EDS signals are acquired during the same electron bombardment.

14. The apparatus according to claim 1, wherein the apparatus comprises one or more STEM detectors, and wherein the apparatus is configured such that:
   a STEM acquisition and an EDS acquisition take place during the same electron bombardment, and
   no STEM and EDS acquisitions are required which are taking place during different electron bombardments.

15. The apparatus according to claim 14, further configured such that the STEM acquisition and the EDS acquisition take place simultaneously.

16. The apparatus according to claim 1, wherein the EDS detectors are silicon drift detectors.

17. The apparatus according to claim 1, wherein the shape of the detecting surface of the EDS detectors is adapted to the configuration of the apparatus so as to be able to place the EDS detectors closer to the specimen compared to an apparatus wherein the detecting surface is circular.

18. The apparatus according to claim 1, wherein at least the laterally positioned EDS detectors are movable, such that the EDS detectors can be placed closer to or farther away from the holder's longitudinal axis.

19. A method of performing a tomographic analysis of a pillar-shaped specimen with an apparatus according to claim 1, the method comprising:
   positioning the specimen at a series of angular positions about the longitudinal axis of the specimen holder;
   at each angular position, directing an electron beam at subsequent raster points on the specimen;
   for each raster point, acquiring signals from the one or more STEM detectors and signals from the EDS detectors, to obtain 2-dimensional images and compositional maps of the specimen at the various angular positions; and
   applying a back-projection algorithm to reconstruct a 3-dimensional volume of the specimen in terms of the morphology and the chemical composition of the specimen, wherein for each raster point, the STEM signals and the EDS signals are acquired during the same electron bombardment.

20. The method according to claim 19, wherein the STEM signals and the EDS signals are acquired simultaneously.

* * * * *